United States Patent
Abadeer et al.

(10) Patent No.: US 7,622,946 B2
(45) Date of Patent: *Nov. 24, 2009

(54) DESIGN STRUCTURE FOR AN AUTOMATIC DRIVER/TRANSMISSION LINE/RECEIVER IMPEDANCE MATCHING CIRCUITRY

(75) Inventors: Wagdi W. Abadeer, Jericho, VT (US);
Louis Lu-Chen Hsu, Fishkill, NY (US);
Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/934,825

(22) Filed: Nov. 5, 2007

(65) Prior Publication Data

US 2009/0115448 A1    May 7, 2009

(51) Int. Cl.
*H03K 17/16* (2006.01)
*H03K 19/003* (2006.01)
*H03L 7/06* (2006.01)

(52) U.S. Cl. .................. 326/30; 327/156; 327/157; 327/158; 327/159; 327/155

(58) Field of Classification Search .................. 326/30
See application file for complete search history.

(56) References Cited

U.S. PATENT DOCUMENTS

| | | |
|---|---|---|
| 5,086,271 A | 2/1992 | Haill et al. |
| 5,453,667 A | 9/1995 | Matsuda et al. |
| 5,479,123 A | 12/1995 | Gist et al. |
| 5,789,937 A | 8/1998 | Cao et al. |
| 5,852,386 A | 12/1998 | Chantry et al. |
| 5,973,575 A | 10/1999 | Kamogawa et al. |
| 6,140,885 A | 10/2000 | Abadeer et al. |
| 6,236,247 B1 | 5/2001 | Ngo |
| 6,249,193 B1 | 6/2001 | Abadeer et al. |
| 6,278,339 B2 | 8/2001 | Abadeer et al. |
| 6,310,490 B1 | 10/2001 | Hui |
| 6,327,464 B1 * | 12/2001 | Hayasaka .................. 455/286 |
| 6,335,632 B1 | 1/2002 | Hui |
| 6,356,104 B1 | 3/2002 | Hui |
| 6,359,465 B1 | 3/2002 | Hui |
| 6,373,276 B1 | 4/2002 | Hui |
| 6,521,506 B1 | 2/2003 | Coolbaugh et al. |
| 6,859,509 B1 | 2/2005 | Koudelka |
| 6,967,540 B2 | 11/2005 | du Toit |

(Continued)

OTHER PUBLICATIONS

Response to Second Office Action dated Jan. 5, 2009 in connection with related U.S. Appl. No. 11/679,253, filed Feb. 27, 2007.

(Continued)

*Primary Examiner*—Vibol Tan
*Assistant Examiner*—Matthew C Tabler
(74) *Attorney, Agent, or Firm*—Downs Rachlin Martin PLLC (57) ABSTRACT

A design structure for an impedance matcher that automatically matches impedance between a driver and a receiver. The design structure for an impedance matcher includes a phase-locked loop (PLL) circuit that locks onto a data signal provided by the driver. The impedance matcher also includes tunable impedance matching circuitry responsive to one or more voltage-controlled oscillator control signals within the PLL circuit so as to generate an output signal that is impedance matched with the receiver.

5 Claims, 6 Drawing Sheets

U.S. PATENT DOCUMENTS

| | | | | |
|---|---|---|---|---|
| 7,042,253 | B2* | 5/2006 | Su et al. | 327/17 |
| 7,183,844 | B2* | 2/2007 | Klomsdorf et al. | 330/129 |
| 2005/0184922 | A1* | 8/2005 | Ida et al. | 343/861 |
| 2006/0038628 | A1 | 2/2006 | Khannur | |
| 2008/0218290 | A1* | 9/2008 | Abadeer et al. | 333/32 |

OTHER PUBLICATIONS

First Office Action dated Apr. 16, 2008 in connection with U.S. Appl. No. 11/679,253, filed Feb. 27, 2007.

U.S. Appl. No. 11/679,253, filed Feb. 27, 2007, titled "Automatic Driver/Transmission Line/Receiver Impedance Matching Circuitry," Wagdi W. Abadeer, Louis Lu-Chen Hsu, Jack A. Mandelman.

First Office Action dated Apr. 16, 2008 in connection with related U.S. Appl. No. 11/679,253, filed Feb. 27, 2007.

Response to First Office Action dated May 28, 2008 in connection with related U.S. Appl. No. 11/679,253, filed Feb. 27, 2007.

Second Office Action dated Oct. 16, 2008 in connection with related U.S. Appl. No. 11/679,253, filed Feb. 27, 2007.

Notice of Allowance dated Apr. 6, 2009, in connection with related U.S. Appl. No. 11/679,253.

* cited by examiner

(12) United States Patent

DESIGN STRUCTURE FOR AN AUTOMATIC DRIVER/TRANSMISSION LINE/RECEIVER IMPEDANCE MATCHING CIRCUITRY

FIELD OF THE DISCLOSURE

The present disclosure generally relates to the field of driver/transmission line/receiver impedance matching between electronic components. In particular, the present disclosure is directed to a design structure for an automatic driver/transmission line/receiver impedance matching circuitry.

BACKGROUND

For scaled CMOS technologies operating at a very high frequency, especially in the gigahertz (GHz) frequency range, the reactive component of the impedance mismatch between a receiver and a driver may cause significant voltage overshoots and undershoots. These voltage transients are a concern because they can cause leakage currents due to forward biasing of diffusions, which may result in functionality and performance problems. Additionally, these voltage transients may lead to degradation of device reliability and reduction of device reliability margins. Accelerated reliability degradation occurs as a result of hot carriers as well as negative bias temperature instability. The voltage transients increase the effective voltage and electric field present across the gate-oxide of the scaled CMOS products that are already ultrahigh. This increase in electric field can significantly impact gate-oxide reliability and product reliability margins.

SUMMARY OF THE DISCLOSURE

In one embodiment, the present disclosure is directed to a design structure embodied in a machine readable medium used in a design process for a circuit for automatically matching impedance between a driver and a receiver. The design structure of the circuit includes a phase-locked loop (PLL) that includes a first input for receiving a data signal from the driver, the PLL comprising a first voltage controlled oscillator (VCO) for providing a first output frequency responsive to a first VCO control voltage generated by the PLL as a function of the data signal; and impedance matching circuitry for generating an impedance-matched signal, the impedance matching circuitry including: a second input for receiving the data signal from the driver; an output for providing the impedance-matched signal to the receiver; and a first variable-capacitance capacitor having a first capacitance controlled by the first VCO control voltage, the first variable-capacitance capacitor having an input for electrically communicating with the driver and an output for electrically communicating with the receiver.

In another embodiment, the present disclosure is directed to a design structure embodied in a machine readable medium for performing a method of automatically matching impedance between a communications driver and a corresponding receiver. The design structure of the method includes a means for receiving a data signal from the communications driver; a means for generating a voltage controlled oscillator (VCO) control voltage as a function of the data signal; a means for driving a VCO as a function of the VCO control voltage; a means for automatically generating an impedance match signal as a function of the VCO control voltage and the data signal; and a means for providing the impedance match signal to the corresponding receiver.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
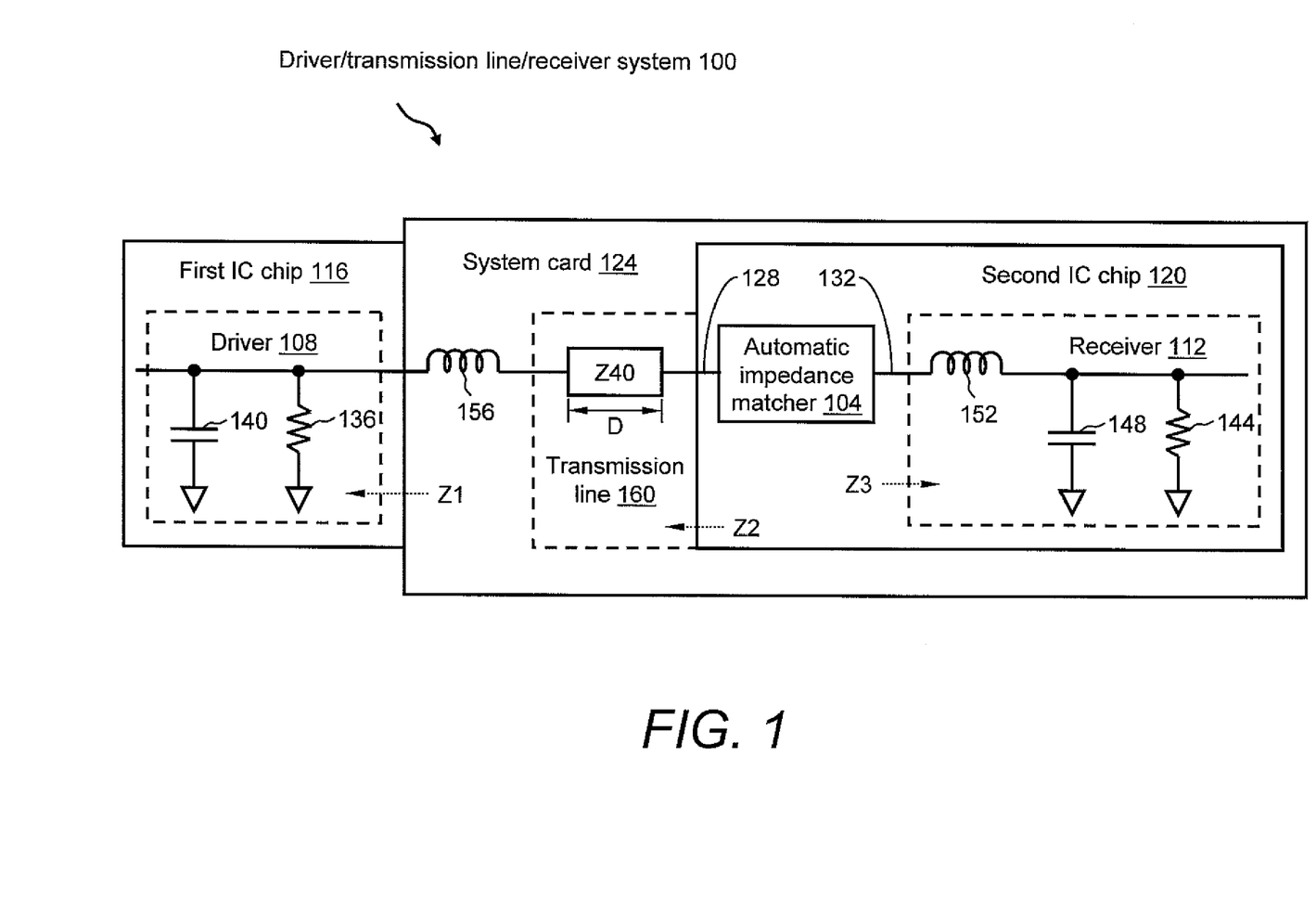
FIG. 1 illustrates a high level block diagram of an example of a driver/transmission line/receiver system that includes automatic driver/transmission line/receiver impedance matching circuitry.

The present invention is directed to a design structure for an automatic driver/transmission line/ receiver impedance matching circuitry. Referring now to the drawings, FIG. 1 illustrates an example 100 of a driver/transmission line/receiver system made in accordance with the present invention. Driver/transmission line/receiver system 100 includes an automatic impedance matcher 104 for automatically matching the impedance as between a driver and a receiver, in this example, driver 108 and receiver 112 aboard, respectively, a first integrated circuit (IC) chip 116 and a second IC chip 120. In this example, second IC chip 120 is installed on a system card 124, whereas first IC chip 116 is external to the system card. In other embodiments, driver 108 and receiver 112 may be located differently, as may be first and second IC chips 116, 120, if either or both are provided at all. Also in this example, automatic impedance matcher 104 is shown as being incorporated into second IC chip 120. However, in other embodiments, the automatic impedance matcher, such as matcher 104, may be provided elsewhere, such as in first IC chip 116 or independent of either of the first IC chip and second IC chip 120. During operation, automatic impedance matcher 104 receives an input signal 128 of a certain first impedance and generates an output signal 132 of a certain second impedance that matches or substantially matches the first impedance of the input signal. In general, impedance matching is to make the output impedance of a source equal to the input impedance of the load to which it is physically connected in order to maximize the power transfer and minimize reflections from the load.

In addition to the various components of driver/transmission line/receiver system 100, FIG. 1 also illustrates an exemplary electrical model of the system. In this case, driver 108 includes a resistance 136, which may be, for example, about 50 ohms, and a capacitance 140, which may be, for example, about 3.7 picofarads (pF). Similarly, in this example receiver 112 includes resistance 144, which may be, for example, about 50 ohms, and a capacitance 148, which may be, for example, about 4 pF to about 5 pF. These values of resistances 136, 144 and capacitances 140, 148 are merely illustrative and may be different in other applications. The chip packaging (not shown) of second IC chip 120 in this model provides a receiver inductance 152, and chip packaging connections provide a driver inductance 156. The values of receiver inductance 152 and driver inductance 156 may each be, for example, about 2 nanohenries (nH). A transmission line 160 may have a length D and may be formed of printed strips of conductive material (not shown) on system card 124. Transmission line 160 may have a characteristic impedance Z40 of, for example, about 50 ohms.

Within driver/transmission line/receiver system 100 of FIG. 1, driver 108 may be considered to have an effective output impedance Z1. Output impedance Z1 in combination with inductance 156 and transmission line 160 may be considered to present an effective impedance Z2 at the input of automatic impedance matcher 104, and receiver 112 may be considered to have an effective input impedance Z3. In a scenario in which input impedance Z3 of receiver 112 differs from impedance Z2, automatic impedance matcher 104 provides an impedance matching mechanism that automatically matches, or nearly matches, the driver and the receiver reactance. This automatic matching substantially reduces or eliminates voltage overshoot and undershoot at the input of receiver 112.

Figure 5:
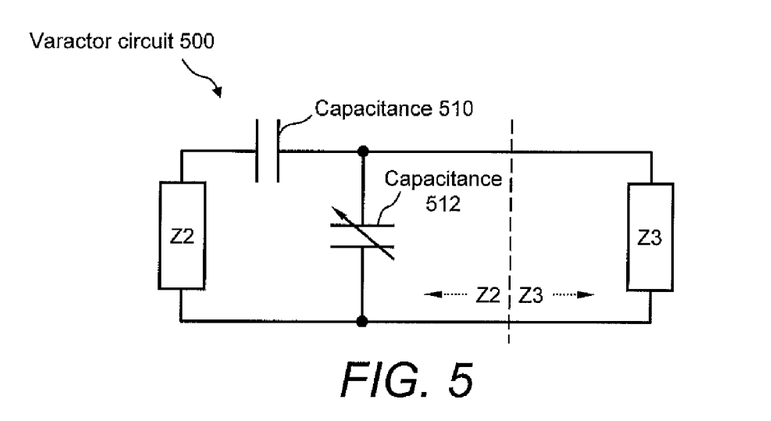
FIG. 5 illustrates a schematic diagram of another example of a varactor circuit model of a frequency matching mechanism for impedance matching circuitry.

As described below in more detail, automatic impedance matcher 104 may include one or more variable-capacitance capacitors, such as, but not limited to, high dielectric constant, or "high-k", or regular-k variable-capacitance capacitors. Automatic impedance matcher 104 may operate across one or more frequency ranges, such as across VHF to GHz frequency ranges, and without requiring matching inductances. For example, one or more matching capacitor (such as shown in FIGS. 3 and 5 at 310, 510 and 512) may be inserted in series or in parallel with receiver 1 12. Within automatic impedance matcher 104, capacitive matching can be achieved electronically by sensing the frequency of the incoming driver signal (in this example, signal 128) via, for example, a PLL circuit (shown in FIG. 2) and automatically providing the appropriate matching capacitance via, for example, one or more variable-capacitance capacitors. Particular examples of impedance matching circuitry that may be used as automatic impedance matcher 104 of FIG. 1 are presented below with reference to FIGS. 2 through 7.

Figure 2:
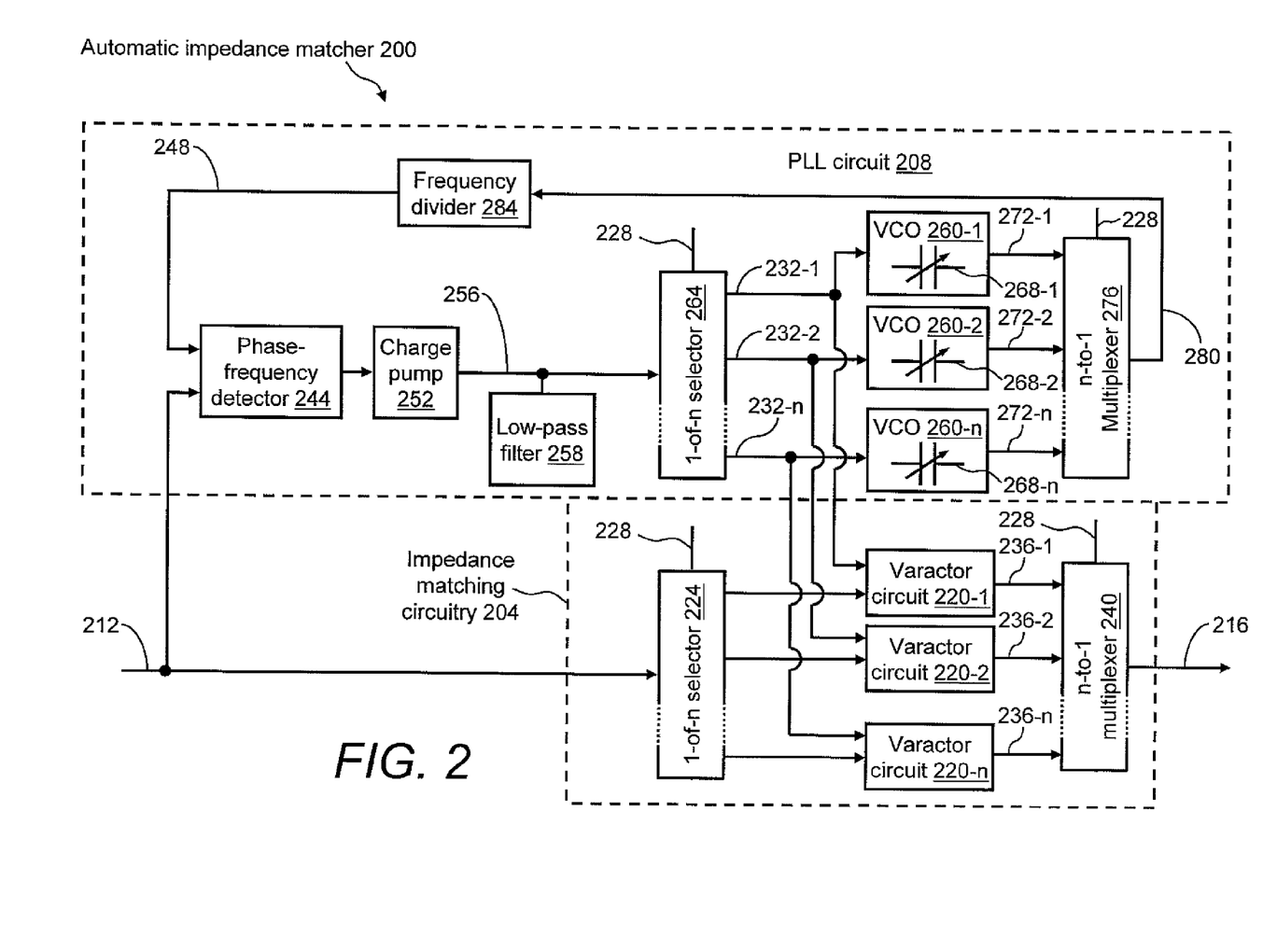
FIG. 2 illustrates a high level block diagram of an example of an automatic impedance matcher for use in an integrated circuit.
Figure 3:
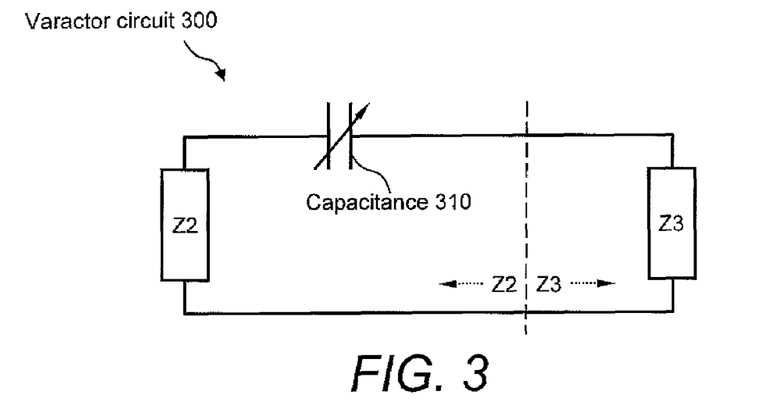
FIG. 3 illustrates a schematic diagram of an example of a varactor circuit model of a frequency matching mechanism for impedance matching circuitry.

FIG. 2 illustrates an example 200 of automatic impedance matcher for use in a driver/transmission line/receiver system, such as driver/transmission line/receiver system 100 of FIG. 1. Automatic impedance matcher 200 includes impedance matching circuitry 204 operatively connected to a PLL circuit 208. Each of impedance matching circuitry 204 and PLL circuit 208 receive an incoming driver signal 212 (which may be, for example, incoming driver signal 128 of FIG. 1) of a first impedance. As described below, impedance matching circuitry 204 outputs an impedance-matched signal 216 (which may be, for example, an output 132 feeding receiver 112 of FIG. 1) that is matched, or nearly matched, to the input impedance of a receiver, such as receiver 112 of FIG. 1.

Impedance matching circuitry 204 may include at least one impedance matching mechanism, such as at least one variable-capacitance capacitor that can provide impedance matching over a corresponding frequency range. Alternatively, impedance matching circuitry 204 may include multiple impedance matching mechanisms, such as multiple variable-capacitance capacitors (e.g., multiple varactors), that can provide impedance matching in multiple frequency ranges. In the example shown in FIG. 2, impedance matching circuitry 204 may include multiple varactor circuits 220, such as varactor circuits 220-1 through 220-$n$, that each correspond to a respective frequency range. As will be described below, each varactor circuit 220-1 through 220-$n$ may include one or more capacitive elements, e.g., capacitors, varactors, etc., as needed to suit a particular frequency range.

If automatic impedance matcher 200 is configured to work over multiple frequency ranges, the matcher may be provided with a frequency range selector, such as 1-of-n selector 224, for directing incoming driver signal 212 to the corresponding one of varactor circuits 220-1 through 220-$n$, depending on the frequency range within which the incoming driver signal is expected to fall. A set of one or more program select signals 228 may be used to determine to which varactor circuit 220-1 through 220-$n$ incoming driver signal 212 is directed. The number of program select signals 228 depends on the number of selectable frequency ranges that are provided within impedance matching circuitry 204. Program select signals 228 may be supplied by an internal or external controller (not shown) that may be associated with the IC chip upon which automatic impedance matcher 200 may be installed.

Each variable-capacitance device (not shown) used in each varactor circuit 220-1 through 220-$n$ may be a variable capacitance device whose capacitance varies as a function of an applied voltage. In this example, the capacitance of the varactors in varactor circuits 220-1 through 220-$n$ may be controlled via a set of corresponding respective voltage controlled oscillator (VCO) control voltages 232-1 through 232-$n$ that may be generated by PLL circuit 208 as a function of the frequency of incoming driver signal 212. The capacitance range of each varactor circuit 220-1 through 220-$n$ may be optimized for operation within the corresponding certain frequency range and to provide a certain output impedance and, thus, the varactors circuits provide a selection of output signals 236-1 through 236-$n$, respectively. In one example, each varactor circuit 220-1 through 220-$n$ may be optimized to operate in a certain narrow frequency range within a broad frequency range of, for example, from about 0.1 GHz to about 100 GHz, where the collection of the varactor circuits cover the full broad frequency range. Output signals 236-1 through 236-$n$ of varactors 220-1 through 220-$n$, respectively, may feed an n-to-1 multiplexer 240, which may perform a standard multiplexing logic function for directing a selected one of its multiple inputs to become impedance-matched signal 216. N-to-1 multiplexer 240 may be selected by the same program select signals 228 used to control the frequency range selector, such as 1-of-n selector 224. More details of example configurations of varactors 220 may be found with reference to FIGS. 3 through 7.

PLL circuit 208 of automatic impedance matcher 200 may be considered the mechanism for determining the frequency of incoming driver signal 212, and generating VCO control voltages 232-1 through 232-$n$ that are provided, respectively, to varactor circuits 220-1 through 220-$n$, of impedance matching circuitry 204 to provide the matching, or near matching, capacitance of impedance-matched signal 216. PLL circuit 208 may included a phase-frequency detector 244 that compares the frequency and phase of incoming driver signal 212 and a feedback signal 248 and generates an output that reflects a difference between the two input signals. The output of phase-frequency detector 244 feeds a charge pump 252. Charge pump 252 may be any charge pump circuit for receiving a direct current (DC) input voltage and generating a multiple thereof at its output. In one example, charge pump 252 may be a voltage-doubler circuit and, thus, for example, when the output of phase-frequency detector 244 is about 1 volt, the output voltage 256 of the charge pump is about 2 volts. The output voltage 256 of charge pump 252 may be connected to a low-pass filter 258, which may be any filter circuit for removing unwanted signal components from a DC voltage node, such as from output voltage 256. In one example, low-pass filter 258 may be a decoupling capacitor for smoothing output voltage 256.

PLL circuit 208 may by configured to operate within each of the frequency ranges of impedance matching circuitry 204. In the example shown in FIG. 2, PLL circuit 208 includes multiple VCOs 260-1 through 260-$n$, that correspond respectively to the same 1 through n frequency ranges of impedance matching circuitry 204. If automatic impedance matcher 200 is configured for multiple frequency ranges, it may be provided with a frequency range selector, such as 1-of-n selector 264, which directs output voltage 256 of charge pump 252 to the proper one of VCOs 260-1 through 260-$n$ that corresponds to the frequency range within which incoming driver signal 212 is expected to fall. One-of-n selector 264 may be identical or substantially the same as 1-of-n selector 224 of impedance matching circuitry 204. Similarly, the same program select signals 228 that may feed 1-of-n selector 224 and n-to-1 multiplexer 240 of impedance matching circuitry 204 may be provided to 1-of-n selector 264 to determine to which one of VCOs 260-1 through 260-$n$ output voltage 256 of charge pump 252 is directed. Those skilled in the art will understand that VCOs 260-1 through 260-$n$ may include corresponding respective varactors 268-1 through 268-$n$. In one example, the electrical characteristics of varactors 268-1 through 268-$n$ of VCOs 260-1 through 260-n of PLL circuit 208 are substantially the same as the electrical characteristics of varactor circuits 220-1 through 220-$n$, respectively, of impedance matching circuitry 204.

In a multiple frequency range embodiment, the frequency range of each VCO 260-1 through 260-$n$ may be a relatively narrow frequency range within a broad frequency range, for example, from about 0.1 GHz to about 100 GHz, that corresponds to the frequency range discussed above in connection with varactor circuits 220-1 through 220-$n$, such that the collection of VCOs 260-1 through VCO 260-$n$ cover the full broad frequency range. The output signals 272-1 through 272-$n$ of VCO 260-1 through VCO 260-$n$, respectively, may be provided to an n-to-1 multiplexer 276, which performs a multiplexing logic function for directing a selected one of its multiple inputs to be an output signal 280. N-to-1 multiplexer 276 may be responsive to the same program select signals 228 used to control 1-of-n selector 224 and n-to-1 multiplexer 240 of impedance matching circuitry 204 and 1-of-n selector 264 of PLL circuit 208.

Output signal 280 of n-to-1 multiplexer 276 may be provided to a frequency divider 284 that receives an input clock of a certain frequency and then generates an output clock that may be a fraction or multiple of its input clock. In one example, frequency divider 284 receives output signal 280 of n-to-1 multiplexer 276, which is a certain frequency, and then generates feedback signal 248 that, as mentioned above, is provided to phase-frequency detector 244. The phase and frequency difference between incoming driver signal 212, which is a reference signal that does not change, and feedback signal 248 is reflected at the output of phase-frequency detector 244 to which the overall operation of PLL circuit 208 reacts until a locked status is achieved. As a result, PLL circuit 208 is tuned to match the frequency of incoming driver signal 212.

In one example, when program select signals 228 are binary 001, 1-of-n selector 264 outputs output voltage 256 of charge pump 252 as VCO control voltage 232-1, which is input to VCO 260-1 that generates a certain output frequency as a function of the voltage level of that VCO control voltage. Additionally, when program select signals 228 are binary 001, output frequency 272-1 of VCO 260-1 is passed to output signal 280 of n-to-1 multiplexer 276 for providing feedback to phase-frequency detector 244. Furthermore, incoming driver signal 212 is directed by 1-of-n selector 224 to varactor circuit 220-1 that provides a certain capacitance as a function of the voltage level of VCO control voltage 232-1 of PLL circuit 208. By sensing the frequency of incoming driver signal 212 via PLL circuit 208, the appropriate matching capacitance is therefore achieved via varactor circuit 220-1 for impedance-matched signal 216.

Continuing with this example, when program select signals 228 are binary 002, 1-of-n selector 264 outputs output voltage 256 of charge pump 252 as VCO control voltage 232-2, which is input to VCO 260-2 that generates a certain output frequency as a function of the voltage level of that VCO control voltage. Additionally, when program select signals 228 are binary 002, output frequency 272-2 of VCO 260-2 is passed to output signal 280 of n-to-1 multiplexer 276 for providing feedback to phase-frequency detector 244. Furthermore, incoming driver signal 212 is directed by 1-of-n selector 224 to varactor circuit 220-2 that provides a certain capacitance as a function of the voltage level of VCO control voltage 232-2 of PLL circuit 208. By sensing the frequency of incoming driver signal 212 via PLL circuit 208, the appropriate matching capacitance is therefore achieved via varactor circuit 220-2 for impedance-matched signal 216.

Figure 4:
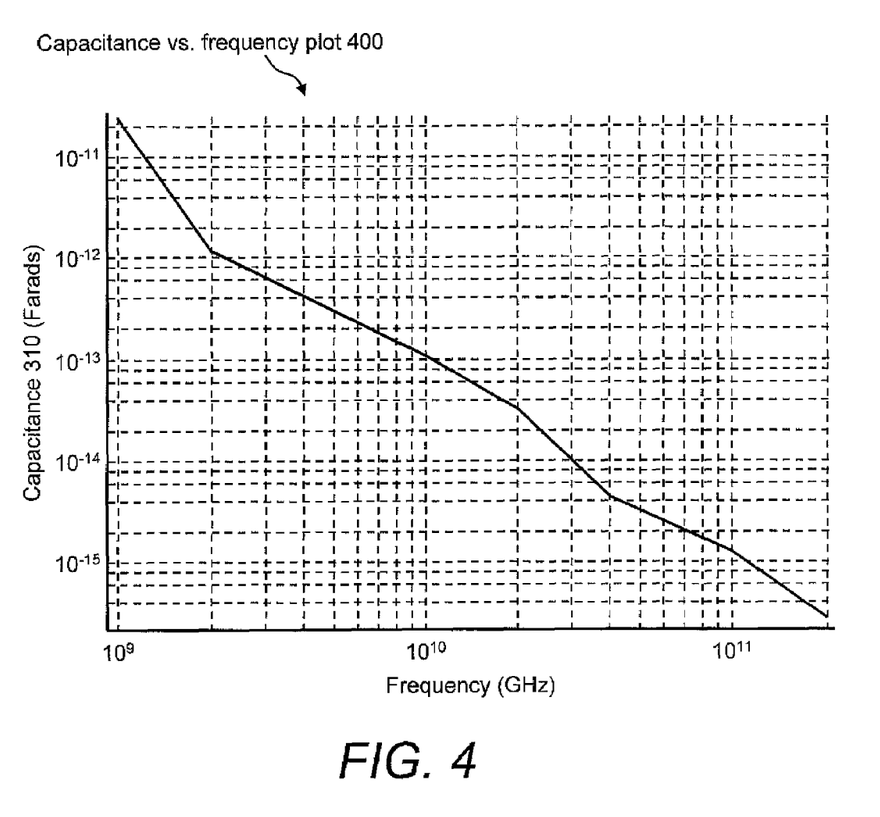
FIG. 4 illustrates an example plot of capacitance vs. frequency for a tuning capacitor of the example varactor circuit model of FIG. 3.

FIG. 3 illustrates an example of a varactor circuit 300 that is suitable for use as a frequency matching mechanism in automatic driver/transmission line/receiver impedance matching circuitry. In this example, varactor circuit 300 is a matching network that includes a capacitance 310 arranged in series with the impedance Z2 (see FIG. 1). Capacitance 310 may be implemented within impedance matching circuit, such as automatic impedance matcher 200 of FIG. 2, as a variable-capacitance capacitor, for example, a varactor. FIG. 4 illustrates an exemplary capacitance vs. frequency plot 400 for capacitance 310 of varactor circuit 300 of FIG. 3. Capacitance vs. frequency plot 400 of FIG. 4 shows series capacitance 310 as having values ranging from about 1 femtofarad (fF) to about 1 pF, which, in this example, is needed for impedance matching within the frequency range of about 2 GHz to about 100 GHz. In this frequency range, the impedance matching may be accomplished by using series capacitance 310 only (i.e., no inductances and no parallel capacitance is required). In capacitance vs. frequency plot 400 of FIG. 4, the relationship between capacitance 310 and frequency in the range of about 2 GHz to about 100 GHz may be represented by a power law fit, which may be expressed as capacitance $310=1.593\times10^7\times F^{-2017}$ (Farad), where F is the frequency in Hertz. Outside the frequency range shown in capacitance vs. frequency plot 400, a series capacitance alone for providing capacitive matching is not possible. In one example, for a frequency range of about 0.1 GHz to about 2 GHz, capacitive matching may be possible by use of a combination of a series capacitance and a parallel capacitance, as illustrated in FIG. 5 below.

FIG. 5 illustrates a schematic diagram of another example of a varactor circuit 500 that is suitable for use as a frequency matching mechanism in automatic driver/transmission line/ receiver impedance matching circuit, such as automatic impedance matcher 200 of FIG. 2. In this example, varactor circuit 500 is a matching network that includes a capacitance 510 arranged in series with the impedance Z2 (see FIG. 1) and a capacitance 512 arranged in parallel with the combination of capacitance 510 and impedance Z2. In this example, capacitance 510 is a fixed value and capacitance 512 is variable and may be implemented as a variable-capacitance capacitor, for example, a varactor.

Figure 6:
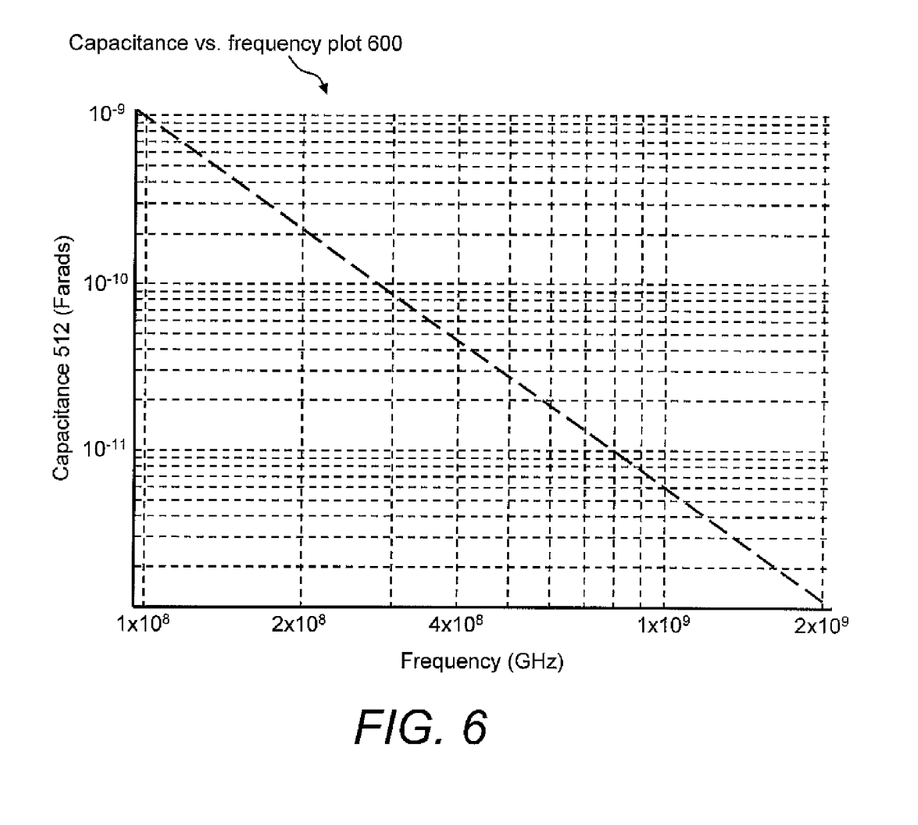
FIG. 6 illustrates another example plot of capacitance vs. frequency for a tuning capacitor of the example varactor circuit model of FIG. 5.

In one example, capacitance 510 is fixed at about 1 pF. FIG. 6 illustrates a capacitance vs. frequency plot 600 for capacitance 512 of FIG. 5 when capacitance 510 is fixed at 1 pF. Capacitance vs. frequency plot 600 of FIG. 6 shows that in this example parallel capacitance 512 has values ranging from about 1 pF to about 1 nanofarad (nF) for impedance matching within the frequency range of about 0.1 GHz to about 2 GHz. In this frequency range, the impedance matching may be by use of both a series capacitance 510 and the parallel capacitance 512, still with no inductances. In one example, capacitance 510 of about 1 pF may be obtained by use of a thin oxide field-effect transistor (FET) that has an oxide thickness of about 5 nanometers (nm) and an oxide area of about 138 square microns. In capacitance vs. frequency plot 600 of FIG. 6, capacitance 512 versus frequency in the range of about 0.1 GHz to about 2 GHz, may be represented by a power law fit, which may be expressed as capacitance $512=5.972 \times 10^8 \times F^{-2.22}$ (Farad). More details of an example of impedance matching circuitry that employs two frequency ranges by use of the example varactor circuits that are described in FIGS. 3, 4, 5, and 6 above are provided with reference to FIG. 7.

Figure 7:
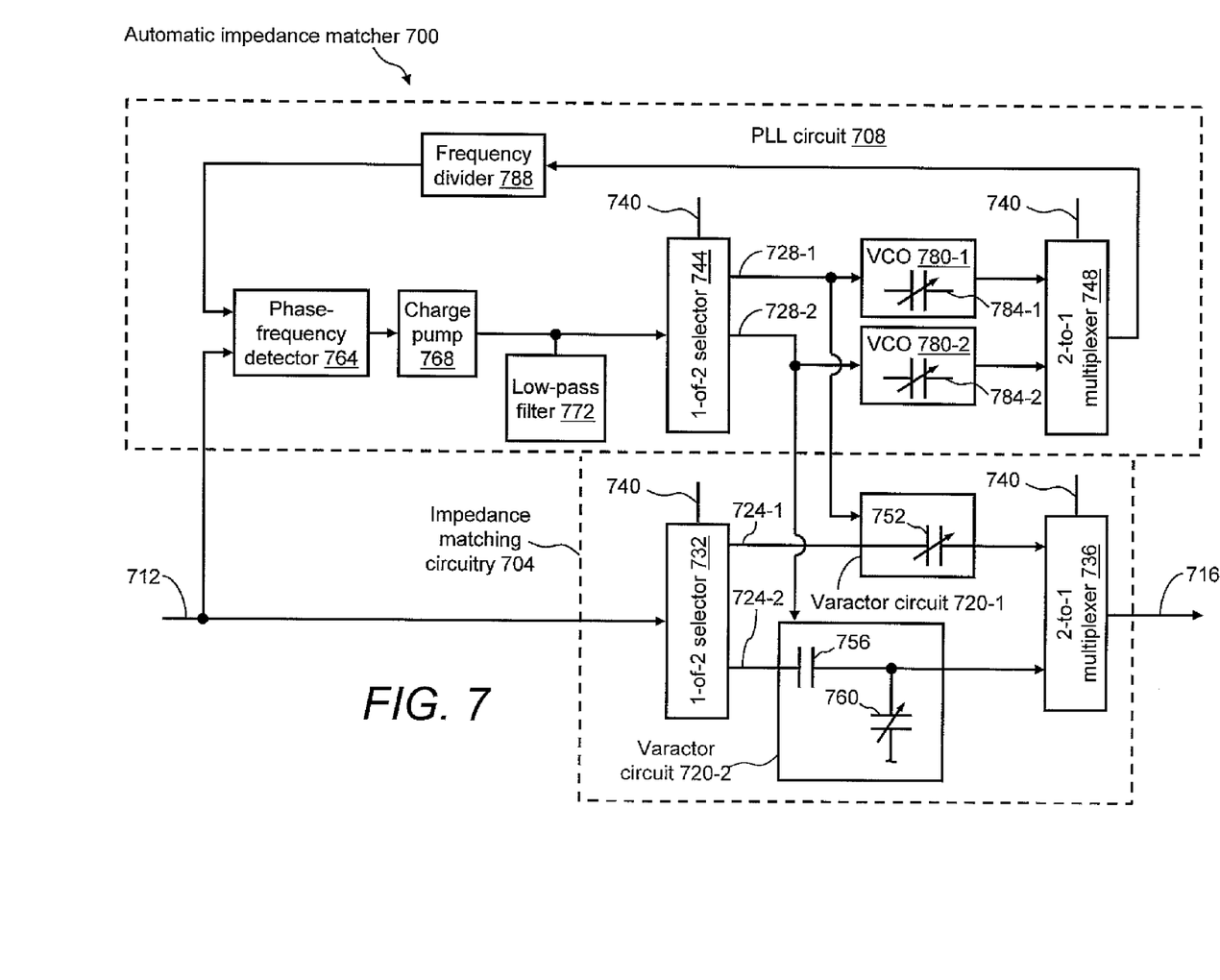
FIG. 7 illustrates a high level block diagram of another example of an automatic impedance matcher that provides two frequency ranges.

Referring to FIG. 7, this figure illustrates an example 700 of automatic driver/transmission line/receiver impedance matcher that provides automatic impedance matching over two frequency ranges. In this example, the two frequency ranges are about 0.1 GHz to about 2 GHz and about 2 GHz to about 100 GHz (corresponding to varactor circuits 500 and 300 of FIGS. 5 and 3, respectively). Again, the corresponding respective capacitance vs. frequency plots 600, 400 are shown in FIGS. 6 and 4, respectively. Exemplary automatic impedance matcher 700 of FIG. 7 includes impedance matching circuitry 704 operatively connected to a PLL circuit 708. Automatic impedance matcher 700 receives an incoming driver signal 712 from a driver (not shown) and outputs in response thereto an impedance-matched signal 716 that is matched to the input impedance of a receiver (not shown).

In this example, for automatic impedance matcher 700 to work over the two frequency ranges noted above, impedance matching circuitry 704 includes two impedance matching mechanisms, such as the two varactor circuits 720-1, 720-2 that correspond respectively to the two frequency ranges. Each varactor circuit 720-1, 720-2 includes a corresponding variable-capacitance capacitor, or varactor 752, 760, which is controlled by a corresponding VCO control signal 728-1, 728-2 of PLL circuit 708.

Similar to automatic impedance matcher 200 of FIG. 2, impedance matching circuitry 704 of FIG. 7 may include a 1-to-several selector, here a 1-of-2 selector 732 and a several-to-1 multiplexer, here a 2-to-1 multiplexer 736, respectively, that may be controlled by program select signals 740 for selecting the appropriate path through the impedance matching circuitry in a manner similar to the manner described relative to FIG. 2, above. Likewise, PLL circuit 708 may include a 1-to-several selector, here a 1-of-2 selector 744 and a several-to-1 multiplexer, here a 2-to-1 multiplexer 748, respectively that may be controlled by program select signals 740 for selecting the appropriate path through the PLL circuit in a manner similar to the manner described above relative to FIG. 2.

In the present example in which varactor circuit 720-1 corresponds generally to varactor circuit 300 of FIG. 3, varactor circuit 720-1 of FIG. 7 includes a series-connected varactor 752 having a variable capacitance that is variable from, for example, about 1 fF to about 1 pF, which in this example is needed for impedance matching within the frequency range of about 2 GHz to about 100 GHz. (see FIG. 4). Again, the capacitance of varactor 752 is controlled by VCO control signal 728-1 of PLL circuit 708.

Similarly, in the present example in which varactor circuit 720-2 corresponds generally to varactor circuit 500 of FIG. 5, varactor circuit 720-2 includes a series-connected capacitance 756 that is fixed at, for example, about 1 pF, and a parallel-connected varactor 760 that has a variable capacitance that is variable from, for example, about 1 pF to about 1 nF, which in this example is needed for impedance matching within the frequency range of about 0.1 GHz to about 2 GHz (see FIG. 6). The capacitance of varactor 760 is controlled by a VCO control voltage 728-2 of PLL circuit 708.

PLL circuit 708 of FIG. 7 may be substantially the same as PLL circuit 208 of FIG. 2, except that PLL circuit 708 is automatically tunable within two specific frequency ranges. In this connection, PLL circuit 708 may include specifically, a phase-frequency detector 764, a charge pump 768, a low-pass filter 772, and a frequency divider 788, each of which may be substantially the same as, and work substantially the same as, the corresponding phase-frequency detector 244, charge pump 252, low-pass filter 258, and frequency divider 284 of FIG. 2. PLL circuit 708 of FIG. 7 may also include first and second VCO 780-1, 780-2 corresponding to the two frequency ranges. In the embodiment shown, each VCO 780-1, 780-2 includes a corresponding varactor 784-1, 784-2, which in one example may have substantially the same electrical characteristics as the respective varactor 752, 760 of impedance matching circuitry 704. Other aspects of VCOs 780-1, 780-2 may be the same as other aspects described above relative to VCOs 260-1, 260-2 of FIG. 2.

Referring still to automatic impedance matcher 700 of FIG. 7, program select signals 728 are set to select either the frequency range of about 2 GHz to about 100 GHz (which utilizes VCO 780-1 and varactor circuit 720-1) or about 0.1 GHz to about 2 GHz (which utilizes VCO 780-2 and varactor circuit 720-2), depending on the expected frequency of incoming driver signal 712. Program select signals 728 may be supplied by an internal or external controller (not shown).

The varactors of FIG. 7 (i.e., varactors 752, 760, 784-1, 784-2) that are employed in automatic impedance matcher 700, may, if suitable, be of about a 2.5 volt design. In addition, the junction capacitance of such varactors may be given by:

$$C(V)=[CA(V) \times L \times W \times N]+[CP(V) \times 2 \times N \times (W+L)]$$

where, CA(V) and CP(V) are, respectively, capacitance per area and capacitance per length parameters; L and W are, respectively, the length and width of a single varactor cell; and N is the number of varactors or cells that are connected in parallel in order to provide the total capacitance C(V). The components CA(V) and CP(V) may be given by:

$$CA(V)=CAO/[1-(V/pb)]^{ma} \text{ (fF/square microns); and}$$

$$CP(V)=CPO/[1-(V/php)]^{mp} \text{ (fF/microns).}$$

Exemplary values for the above parameters may be: CAO =2.48 fF/square microns, CPO=0.21 fF/microns, ma=1.7, pb=2.56 V, mp=1.75, and php=8.2 V.

Figure 8:
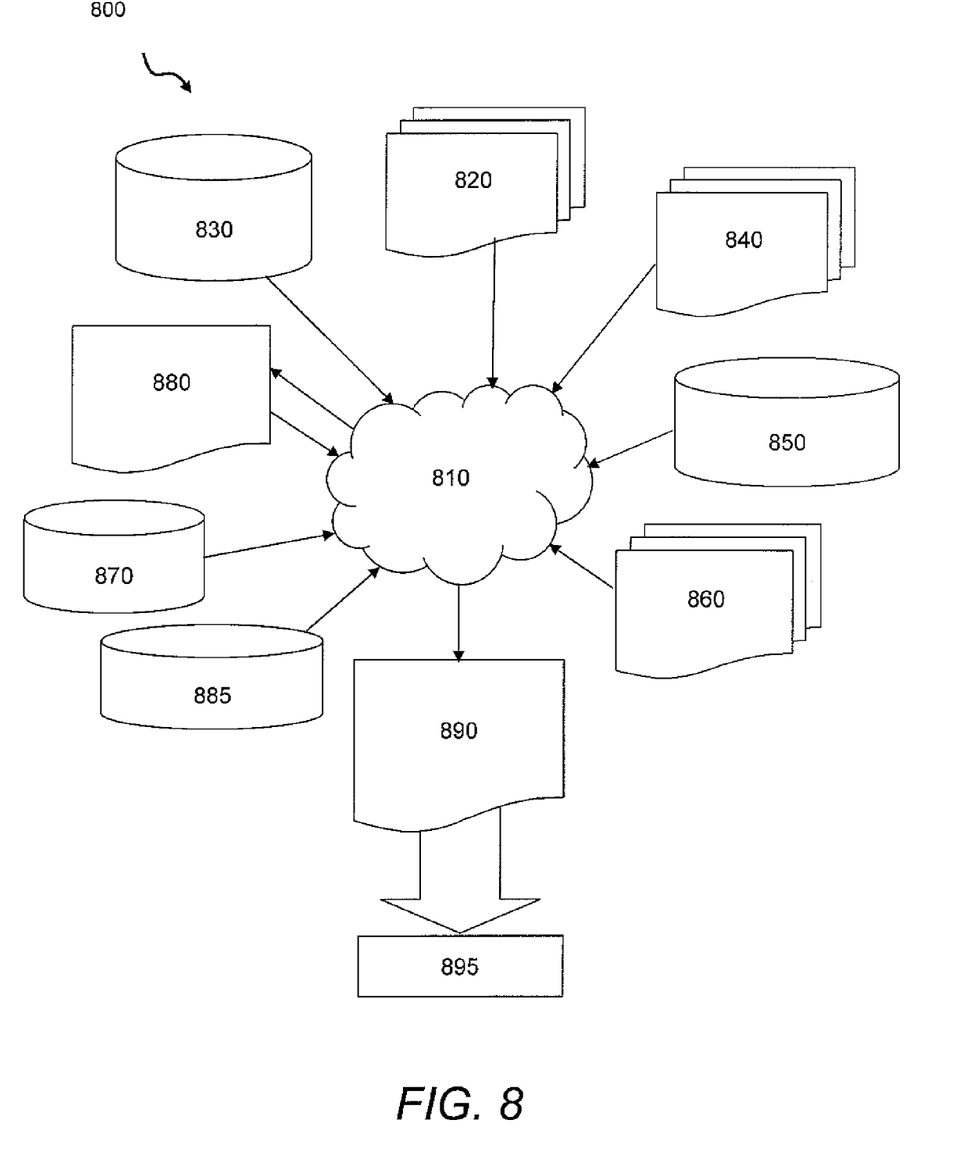
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises circuit 100 in the form of schematics or HDL, a hardware-description language (e.g., Verilog, VHDL, C, etc.). Design structure 820 may be contained on one or more machine readable medium. For example, design structure 820 may be a text file or a graphical representation of circuit 100. Design process 810 preferably synthesizes (or translates) circuit 100 into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Design process 810 preferably translates an embodiment of the invention as shown in FIG. 1, along with any additional integrated circuit design or data (if applicable), into a second design structure 890. Design structure 890 resides on a storage medium in a data format used for the exchange of layout data of integrated circuits (e.g. information stored in a GDSII (GDS2), GLI, OASIS, or any other suitable format for storing such design structures). Design structure 890 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 890 may then proceed to a stage 895 where, for example, design structure 890: proceeds to tape-out, is released to manufacturing, is released to a mask house, is sent to another design house, is sent back to the customer, etc.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A design structure embodied in a machine readable medium used in a design process for a circuit for automatically matching impedance between a driver and a receiver, the design structure of said circuit comprising:
    a phase-locked loop (PLL) that includes a first input for receiving a data signal from the driver, said PLL comprising a first voltage controlled oscillator (VCO) for providing a first output frequency responsive to a first VCO control voltage generated by said PLL as a function of the data signal; and
    impedance matching circuitry for generating an impedance-matched signal, said impedance matching circuitry including:
        a second input for receiving the data signal from the driver;
        an output for providing said impedance-matched signal to the receiver; and
        a first variable-capacitance capacitor having a first capacitance controlled by said first VCO control voltage, said first variable-capacitance capacitor having an input for electrically communicating with the driver and an output for electrically communicating with the receiver.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. A design structure embodied in a machine readable medium for performing a method of automatically matching impedance between a communications driver and a corresponding receiver, the design structure of said method comprising:
    a means for receiving a data signal from the communications driver;
    a means for generating a voltage controlled oscillator (VCO) control voltage as a function of said data signal;
    a means for driving a VCO as a function of said VCO control voltage;
    a means for automatically generating an impedance match signal as a function of said VCO control voltage and said data signal; and
    a means for providing said impedance match signal to the corresponding receiver.

* * * * *